US012671160B2

(12) United States Patent
   Ikemoto

(10) Patent No.: US 12,671,160 B2
(45) Date of Patent: Jun. 30, 2026

(54) MULTILAYER SUBSTRATE, METHOD FOR MANUFACTURING MULTILAYER SUBSTRATE, AND ELECTRONIC DEVICE

(71) Applicant: Murata Manufacturing Co., Ltd., Nagaokakyo (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 355 days.

(21) Appl. No.: 18/383,552

(22) Filed: Oct. 25, 2023

(65) Prior Publication Data

US 2024/0055744 A1    Feb. 15, 2024

Related U.S. Application Data

(63) Continuation of application No. PCT/JP2022/020959, filed on May 20, 2022.

(30) Foreign Application Priority Data

Jun. 3, 2021    (JP) ................................. 2021-093364

(51) Int. Cl.
   H01P 3/08        (2006.01)
   H01P 11/00        (2006.01)
   (Continued)

(52) U.S. Cl.
   CPC .............. H01P 3/08 (2013.01); H01P 11/003 (2013.01); H05K 1/0219 (2013.01); H05K 3/46 (2013.01);
   (Continued)

(58) Field of Classification Search
   CPC ........... H05K 1/0219; H05K 2201/096; H05K 2201/09609; H05K 1/188; H01P 3/08
   See application file for complete search history.

(56) References Cited

U.S. PATENT DOCUMENTS 6,353,189 B1 *  3/2002  Shimada ........... H01L 23/49827
                                                257/E23.105
2006/0086534 A1   4/2006  Oggioni et al.
                    (Continued)

FOREIGN PATENT DOCUMENTS

JP          06224528 A      8/1994
JP        2010028306 A      2/2010
                (Continued)

OTHER PUBLICATIONS

International Search Report in PCT/JP2022/020959, mailed Aug. 16, 2022, 3 pages.
                (Continued)

*Primary Examiner* — Timothy J Thompson
*Assistant Examiner* — John B Freal
(74) *Attorney, Agent, or Firm* — Keating & Bennett, LLP

(57) ABSTRACT

A first conductive layer is in contact with a first inter-layer connection conductor and a second inter-layer connection conductor. The first conductive layer has a same composition as the first and second inter-layer connection conductors. At least one first metal foil layer is in contact with a third main surface of the first conductive layer. The at least one first metal foil layer overlaps the first and second inter-layer connection conductors when viewed in a first direction. At least one second metal foil layer overlaps the first and second inter-layer connection conductors when viewed in the first direction, and is electrically connected to the first and second inter-layer connection conductors. The at least one second metal foil layer has a composition different from that of the first conductive layer.

22 Claims, 13 Drawing Sheets

(51) Int. Cl.
H05K 1/02 (2006.01)
H05K 3/46 (2006.01)

(52) U.S. Cl.
CPC .............. *H05K 2201/09527* (2013.01); *H05K 2201/096* (2013.01); *H05K 2201/09609* (2013.01)

(56) References Cited

U.S. PATENT DOCUMENTS

2006/0274510 A1* 12/2006 Nakada ................ H05K 3/4632
361/748
2009/0158581 A1* 6/2009 Nguyen ................ H05K 3/108
324/754.01
2015/0001648 A1 1/2015 Lee et al.

2017/0149111 A1 5/2017 Yosui et al.
2018/0124928 A1* 5/2018 Rathburn ............ H01L 23/5383
2019/0088388 A1 3/2019 Baba et al.

FOREIGN PATENT DOCUMENTS

JP 2010087429 A 4/2010
JP 2014078835 A 5/2014
JP 2015012605 A 1/2015
JP 2020127228 A 8/2020
WO 9847331 A1 10/1998
WO 2016163436 A1 10/2016

OTHER PUBLICATIONS

Written Opinion in PCT/JP2022/020959, mailed Aug. 16, 2022, 4 pages.

* cited by examiner

MULTILAYER SUBSTRATE, METHOD FOR MANUFACTURING MULTILAYER SUBSTRATE, AND ELECTRONIC DEVICE

CROSS REFERENCE TO RELATED APPLICATIONS

This application claims the benefit of priority to Japanese Patent Application No. 2021-093364 filed on Jun. 3, 2021 and is a Continuation Application of PCT Application No. PCT/JP2022/020959 filed on May 20, 2022. The entire contents of each application are hereby incorporated herein by reference.

BACKGROUND OF THE INVENTION

1. Field of the Invention

The present invention relates to a multilayer substrate having a structure including laminated multiple insulating layers.

2. Description of the Related Art

A multilayer substrate described in Japanese Unexamined Patent Application Publication No. 2020-127228 (FIG. 12) is known as an example of an existing invention relating to a multilayer substrate. This multilayer substrate includes a multilayer body, a first ground conductor, a second ground conductor, first inter-layer connection conductors, and second inter-layer connection conductors. The multilayer body has a structure including multiple insulating substrates vertically laminated. The first ground conductor is disposed on an upper main surface of the insulating substrate. The second ground conductor is disposed on a lower main surface of the insulating substrate. The first inter-layer connection conductors and the second inter-layer connection conductors vertically extend through the insulating substrate. The first inter-layer connection conductors and the second inter-layer connection conductors are connected to the first ground conductor at their upper ends. The first inter-layer connection conductors and the second inter-layer connection conductors are connected to the second ground conductor at their lower ends.

SUMMARY OF THE INVENTION

The multilayer substrate described in Japanese Unexamined Patent Application Publication No. 2020-127228 (FIG. 12) is desired to reduce failures that occur at the connections between the first inter-layer connection conductors and the first ground conductor, at the connections between the first inter-layer connection conductors and the second ground conductor, at the connections between the second inter-layer connection conductors and the first ground conductor, and at the connections between the second inter-layer connection conductors and the second ground conductor.

Preferred embodiments of the present invention provide multilayer substrates, methods for manufacturing multilayer substrates, and electronic devices, each capable of reducing failures that occur at electric connections between multiple inter-layer connection conductors and at least one first metal foil layer, and at electric connections between the multiple inter-layer connection conductors and at least one second metal foil layer.

A multilayer substrate according to an aspect of a preferred embodiment of the present invention includes a multilayer body including a plurality of insulating layers laminated in a first direction, the plurality of insulating layers including a first insulating layer including a first main surface and a second main surface, the first main surface being located above or below the second main surface in the first direction, a plurality of inter-layer connection conductors that extend through the first insulating layer in the first direction, and that include a first inter-layer connection conductor and a second inter-layer connection conductor, a first conductive layer that is in contact with the first main surface of the first insulating layer, and in contact with the first inter-layer connection conductor and the second inter-layer connection conductor, and that includes a third main surface and a fourth main surface, the third main surface being located above or below the fourth main surface in the first direction, and the first conductive layer having a same composition as the first inter-layer connection conductor and the second inter-layer connection conductor, at least one first metal foil layer that is in contact with the third main surface of the first conductive layer, the at least one first metal foil layer overlapping the first inter-layer connection conductor and the second inter-layer connection conductor when viewed in the first direction, the at least one first metal foil layer having a composition different from a composition of the first conductive layer, and at least one second metal foil layer located above or below the first insulating layer in a second direction, the second direction being opposite to the first direction, the at least one second metal foil layer overlapping the first inter-layer connection conductor and the second inter-layer connection conductor when viewed in the first direction, the at least one second metal foil layer being electrically connected to the first inter-layer connection conductor and the second inter-layer connection conductor, the at least one second metal foil layer having a composition different from a composition of the first conductive layer.

A method for manufacturing a multilayer substrate according to an aspect of a preferred embodiment of the present invention, a multilayer substrate including a multilayer body including a plurality of insulating layers including a third insulating layer including a ninth main surface and a tenth main surface, a first insulating layer including a first main surface and a second main surface, and a second insulating layer including a seventh main surface and an eighth main surface, the plurality of insulating layers being laminated to be arranged in a first direction in order of the third insulating layer, the first insulating layer, and the second insulating layer, the first main surface being located lower than the second main surface in the first direction, the seventh main surface being located above or below the eighth main surface in the first direction, and the ninth main surface being located above or below the tenth main surface in the first direction, the method including preparing the first insulating layer including a first through-hole and a second through-hole, preparing the second insulating layer including the eighth main surface on which a first metal foil layer is located, preparing the third insulating layer including the ninth main surface on which a second metal foil layer is located, applying conductive paste or metal cream onto the first metal foil layer after the second preparation step, and after the application step, laminating the third insulating layer, the first insulating layer, and the second insulating layer, filling the first through-hole and the second through-hole with the conductive paste or the metal cream, and allowing the conductive paste or the metal cream to overflow from the first through-hole and the second through-hole to form the conductive paste or the metal cream in the first through-hole and the conductive paste or the metal cream that is in contact with the conductive paste or the metal cream in the first through-hole on the first metal foil layer.

Multilayer substrates according to preferred embodiments of the present invention can reduce failures that occur at the electric connections between multiple inter-layer connection conductors and at least one first metal foil layer, and at the electric connections between the multiple inter-layer connection conductors and at least one second metal foil layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a cross-sectional view of a multilayer substrate 10a.

FIG. 8 is a cross-sectional view of a multilayer substrate 10c.

FIG. 13 is a cross-sectional view of a multilayer substrate 10h taken perpendicular to the vertical direction of the insulating layer 15a.

DETAILED DESCRIPTION OF THE PREFERRED EMBODIMENTS

Preferred Embodiments
Structure of Multilayer Substrate

Figure 1:
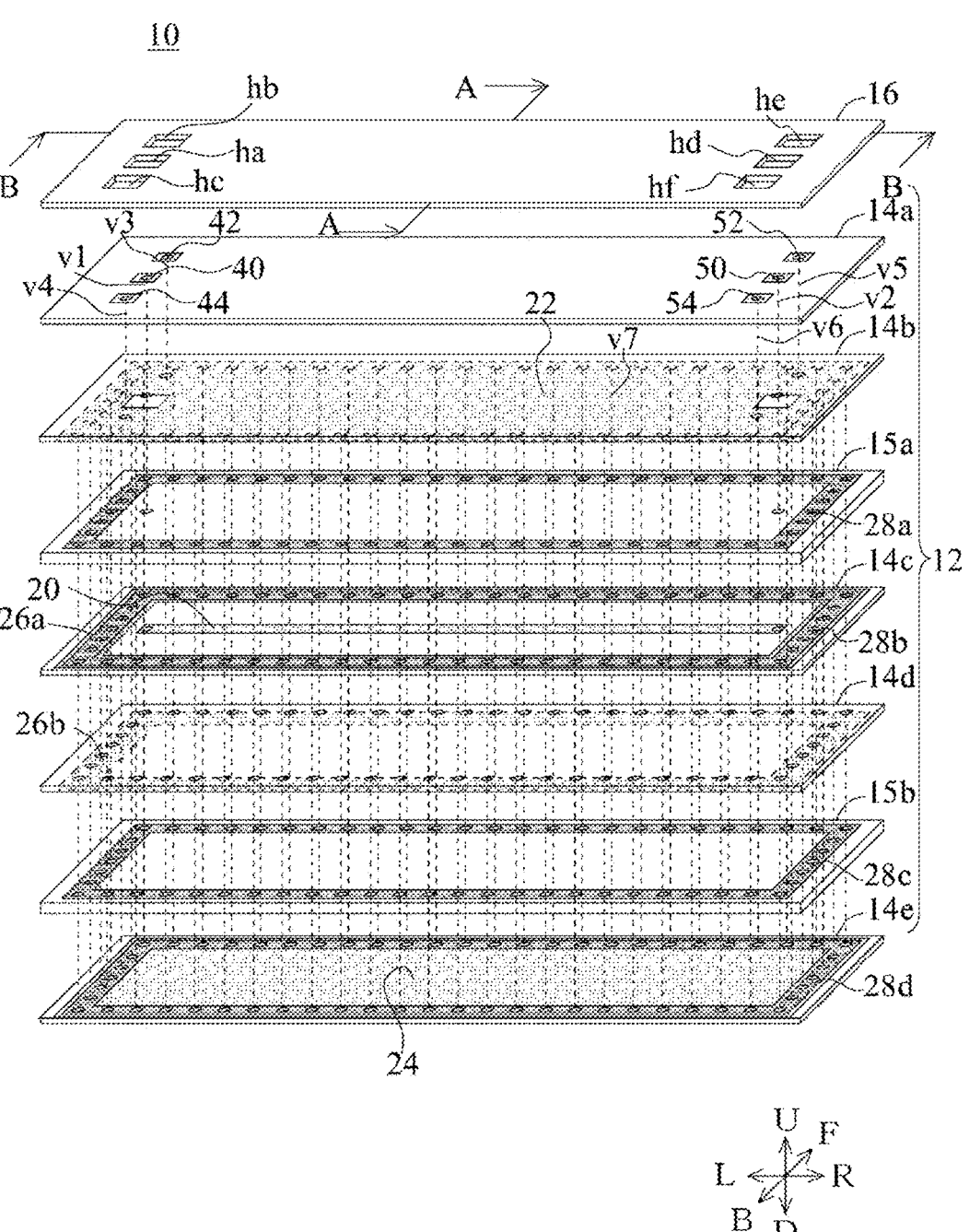
FIG. 1 is an exploded perspective view of a multilayer substrate 10.
Figure 2:
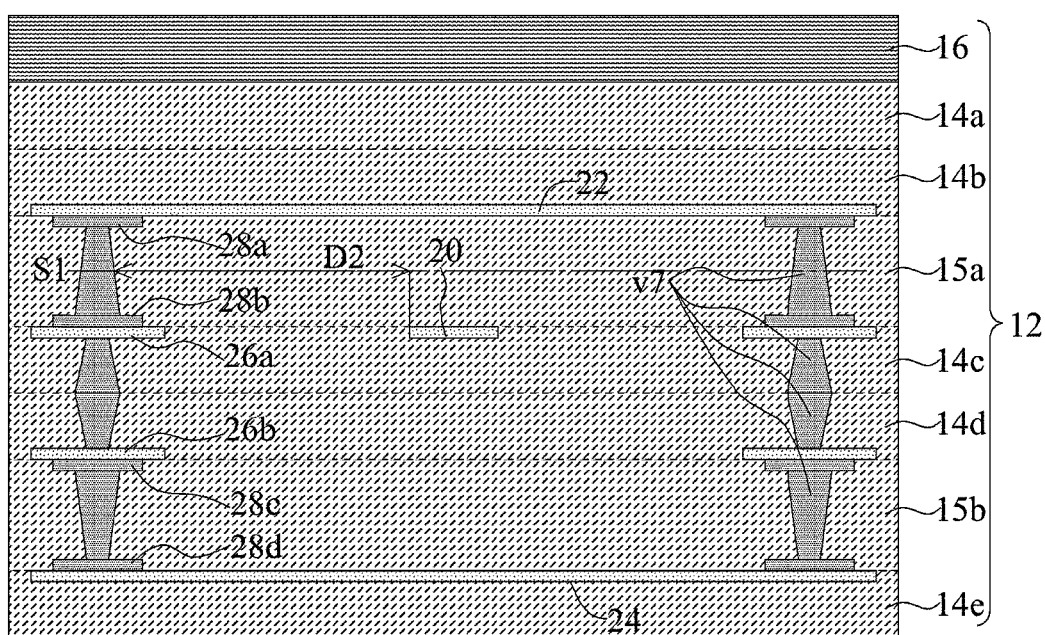
FIG. 2 is a cross-sectional view taken along line A-A in FIG. 1.
Figure 3:
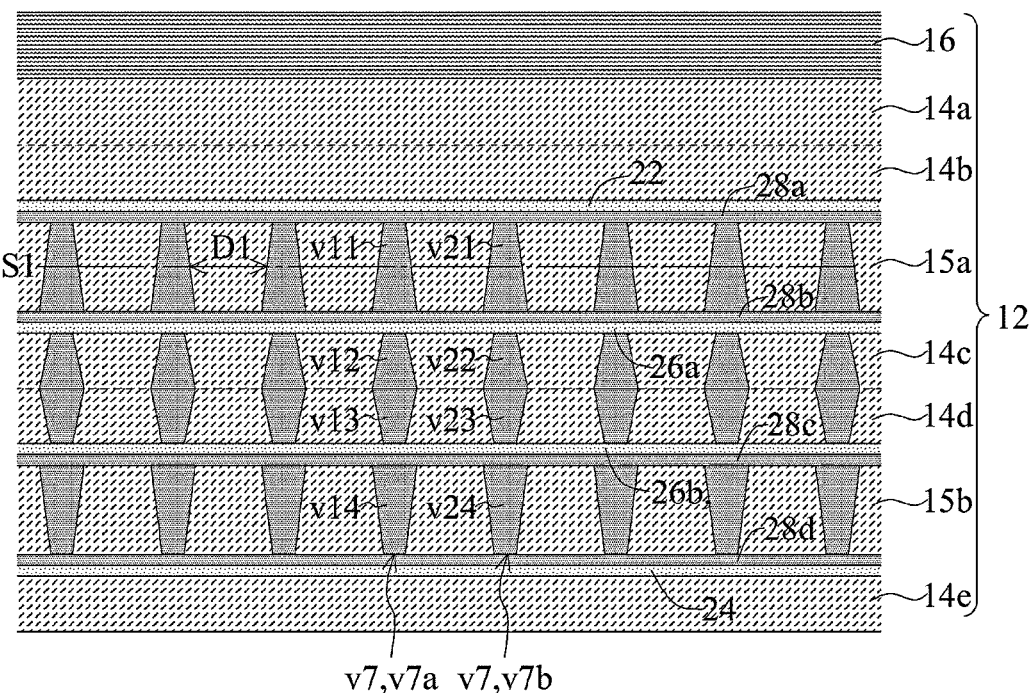
FIG. 3 is a cross-sectional view taken along line B-B in FIG. 1.
Figure 4:
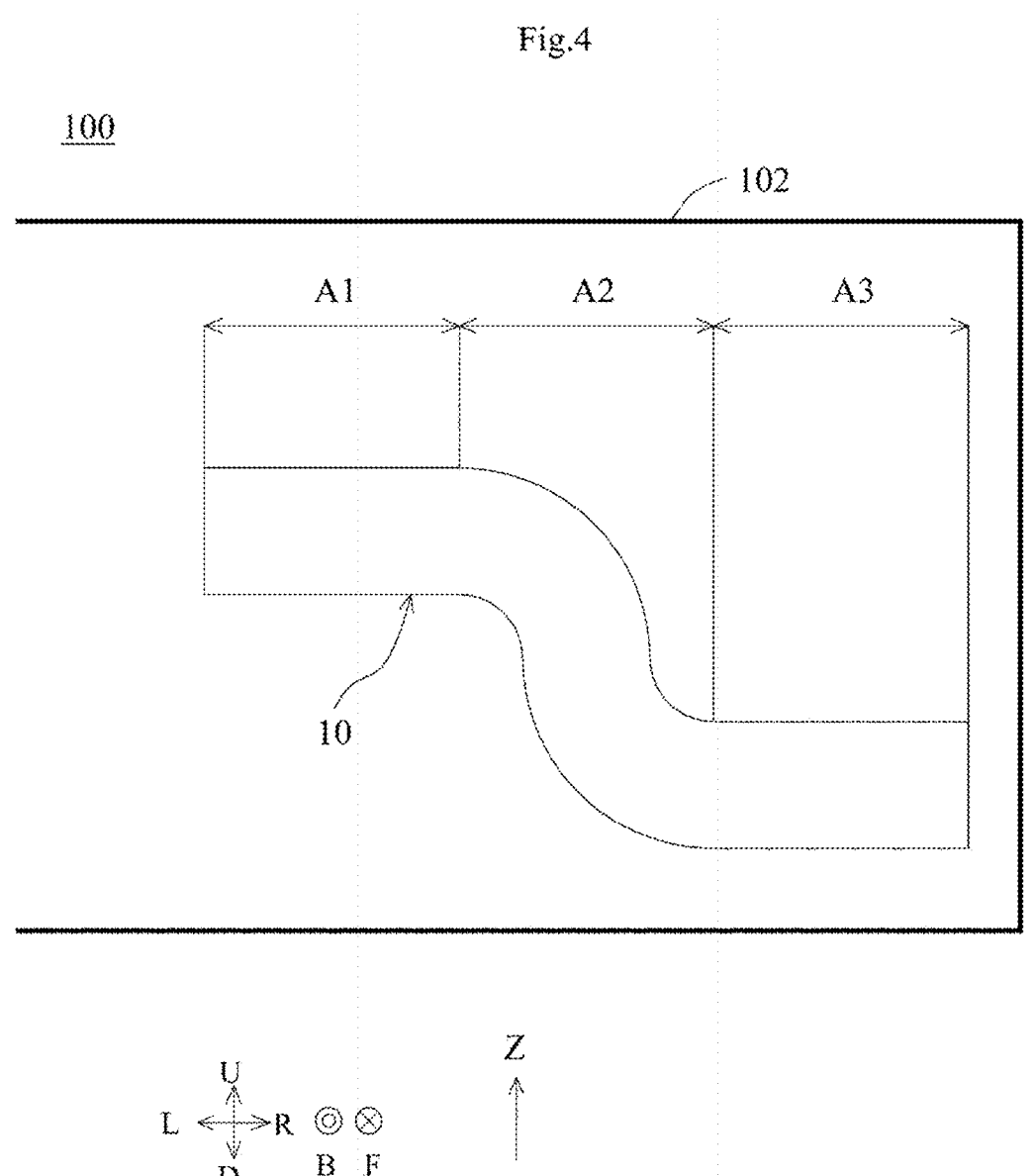
FIG. 4 is a diagram of a portion of an electronic device 100.

A structure of a multilayer substrate 10 according to a preferred embodiment of the present invention is described below with reference to the drawings. FIG. 1 is an exploded perspective view of the multilayer substrate 10. In FIG. 1, only one of multiple inter-layer connection conductors v7 is denoted with the reference sign. FIG. 2 is a cross-sectional view taken along line A-A in FIG. 1. FIG. 3 is a cross-sectional view taken along line B-B in FIG. 1. FIG. 4 is a diagram of a portion of an electronic device 100.

Herein, directions are defined as below. The direction in which multiple insulating layers 14a to 14e, 15a, and 15b are arranged is defined as a vertical direction. An upper direction or a lower direction is a first direction. A second direction is opposite to the first direction. Thus, when the upper direction is the first direction, the lower direction is the second direction. When the lower direction is the first direction, the upper direction is the second direction. The direction in which a first signal conductor layer 20 extends is defined as a lateral direction. The lateral direction is perpendicular to the vertical direction. The direction perpendicular to the lateral direction and the vertical direction is defined as a front-rear direction. The vertical direction, the front-rear direction, and the lateral direction according to the present preferred embodiment may be different from the vertical direction, the front-rear direction, and the lateral direction of the multilayer substrate 10 in use.

Hereinbelow, X denotes a component or a member of the multilayer substrate 10. Herein, unless otherwise particularly noted, portions of X are defined as below. A front portion of X indicates a front half of X. A rear portion of X indicates a rear half of X. A left portion of X indicates a left half of X. A right portion of X indicates a right half of X. An upper portion of X indicates an upper half of X. A lower portion of X indicates a lower half of X. A front end of X indicates an end of X in the front direction. A rear end of X indicates an end of X in the rear direction. A left end of X indicates an end of X in the left direction. A right end of X indicates an end of X in the right direction. An upper end of X indicates an end of X in the upper direction. A lower end of X indicates an end of X in the lower direction. A front end portion of X indicates the front end of X and its periphery. A rear end portion of X indicates the rear end of X and its periphery. A left end portion of X indicates the left end of X and its periphery. A right end portion of X indicates the right end of X and its periphery. An upper end portion of X indicates the upper end of X and its periphery. A lower end portion of X indicates the lower end of X and its periphery.

First, with reference to FIG. 1, a structure of the multilayer substrate 10 is described. The multilayer substrate 10 transmits high-frequency signals. The multilayer substrate 10 is used in an electronic device, such as a smartphone, to electrically connect two circuits. As illustrated in FIG. 1, the multilayer substrate 10 includes a multilayer body 12, a protective layer 16, the first signal conductor layer 20, a reference conductive layer 22 (a second metal foil layer), a reference conductive layer 24 (a second metal foil layer), a reference conductive layer 26a (a first metal foil layer), a reference conductive layer 26b (a first metal foil layer), first conductive layers 28b and 28c, second conductive layers 28a and 28d, signal terminals 40 and 50, reference terminals 42, 44, 52, and 54, inter-layer connection conductors v1 to v6, and multiple inter-layer connection conductors v7.

The multilayer body 12 has a structure in which the insulating layers 14a to 14e, 15a, and 15b (multiple insulating layers) are laminated to be arranged in the vertical direction (the first direction). In the present preferred embodiment, multiple insulating layers 14a, 14b, 15a, 14c, 14d, 15b, and 14e are arranged in this order from the top to the bottom. Each of the insulating layers 14a and 14e includes an upper main surface and a lower main surface. Each of the insulating layers 14a and 14e has a rectangular shape when viewed in the vertical direction. The long sides of the insulating layers 14a and 14e extend in the lateral direction.

The insulating layer 15a includes an upper main surface (a second main surface) and a lower main surface (a first main surface). In the insulating layer 15a, the lower main surface (the first main surface) is located lower than (in the first direction from) the upper main surface (the second main surface). The insulating layer 15b includes an upper main surface (a first main surface) and a lower main surface (a second main surface). In the insulating layer 15b, the upper main surface (the first main surface) is located higher than (in the first direction from) the lower main surface (the second main surface). The insulating layers 15a and 15b have a rectangular shape when viewed in the vertical direction. The long sides of the insulating layers 15a and 15b extend in the lateral direction.

The insulating layers 14a to 14e, 15a, and 15b include thermoplastic resin. Examples of thermoplastic resin includes a liquid crystal polymer and polytetrafluoroethylene (PTFE). The insulating layers 14a to 14e, 15a, and 15b may include polyimide.

As illustrated in FIG. 1 and FIG. 2, the first conductive layer 28b is in contact with the lower main surface (the first main surface) of the insulating layer 15a (the first insulating layer). The first conductive layer 28b includes an upper main surface (a fourth main surface) and a lower main surface (a third main surface). In the first conductive layer 28b, the lower main surface (the third main surface) is located lower than (in the first direction from) the upper main surface (the fourth main surface). The first conductive layer 28b has a rectangular loop shape when viewed in the lower direction (the first direction). More specifically, the first conductive layer 28b extends along the two long sides and the two short sides of the insulating layer 15a when viewed in the vertical direction.

The second conductive layer 28a is in contact with the upper main surface (the second main surface) of the insulating layer 15a (the first insulating layer). The second conductive layer 28a includes an upper main surface (a sixth main surface) and a lower main surface (a fifth main surface). In the second conductive layer 28a, the lower main surface (the fifth main surface) is located lower than (in the first direction from) the upper main surface (the sixth main surface). The second conductive layer 28a has the same shape as the first conductive layer 28b when viewed in the vertical direction. The second conductive layer 28a has a rectangular loop shape when viewed in the vertical direction. More specifically, the second conductive layer 28a extends along the two long sides and the two short sides of the insulating layer 15a when viewed in the vertical direction. The entire external edge of the second conductive layer 28a overlaps the entire external edge of the first conductive layer 28b when viewed in the vertical direction. The entire internal edge of the second conductive layer 28a overlaps the entire internal edge of the first conductive layer 28b when viewed in the vertical direction.

The reference conductive layer 26a is located on the upper main surface of the insulating layer 14c. The first conductive layer 28b is located on the reference conductive layer 26a. Thus, the reference conductive layer 26a (the first metal foil layer) is in contact with the lower main surface (the third main surface) of the first conductive layer 28b. The reference conductive layer 26a has a rectangular loop shape when viewed in the vertical direction. More specifically, the reference conductive layer 26a extends along the two long sides and the two short sides of the insulating layer 14c when viewed in the vertical direction. The external edge of the reference conductive layer 26a is located slightly outward from the external edge of the first conductive layer 28b when viewed in the vertical direction. The internal edge of the reference conductive layer 26a is located slightly inward from the internal edge of the first conductive layer 28b when viewed in the vertical direction.

The reference conductive layer 22 is located on the lower main surface of the insulating layer 14b. Thus, the reference conductive layer 22 is located higher than (in the second direction from) the insulating layer 15a (the first insulating layer). Specifically, the reference conductive layer 22 (a second metal foil layer) is located higher than (in the second direction from) the insulating layer 15a (the first insulating layer). The second conductive layer 28a is located lower than the reference conductive layer 22. Thus, the reference conductive layer 22 (the second metal foil layer) is in contact with the upper main surface (the sixth main surface) of the second conductive layer 28a. The reference conductive layer 22 has a rectangular shape when viewed in the vertical direction. More specifically, the reference conductive layer 22 covers substantially throughout the lower main surface of the insulating layer 14b when viewed in the vertical direction. Here, to prevent the reference conductive layer 22 from coming into contact with the inter-layer connection conductors v1 and v2 described below, the reference conductive layer 22 has openings at positions where it overlaps the inter-layer connection conductors v1 and v2 when viewed in the vertical direction.

The first conductive layer 28c, the second conductive layer 28d, and the reference conductive layers 24 and 26b are the opposite half of a vertically symmetric structure to the first conductive layer 28b, the second conductive layer 28a, and the reference conductive layers 22 and 26a. More specifically, the first conductive layer 28c is in contact with the upper main surface (the first main surface) of the insulating layer 15b (the first insulating layer). The first conductive layer 28c includes an upper main surface (a third main surface) and a lower main surface (a fourth main surface). In the first conductive layer 28c, the upper main surface (the third main surface) is located higher than (in the first direction from) the lower main surface (the fourth main surface). The first conductive layer 28c has a rectangular loop shape when viewed in the vertical direction (the first direction). More specifically, the first conductive layer 28c extends along the two long sides and the two short sides of the insulating layer 14e when viewed in the vertical direction.

The second conductive layer 28d is in contact with the lower main surface (the second main surface) of the insulating layer 15b (the first insulating layer). The second conductive layer 28d includes an upper main surface (a fifth main surface) and a lower main surface (a sixth main surface). In the second conductive layer 28d, the upper main surface (the fifth main surface) is located higher than (in the first direction from) the lower main surface (the sixth main surface). The second conductive layer 28d has the same shape as the first conductive layer 28c when viewed in the vertical direction. The second conductive layer 28d has a rectangular loop shape when viewed in the vertical direction (first direction). More specifically, the second conductive layer 28d extends along the two long sides and the two short sides of the insulating layer 15b when viewed in the vertical direction. The entire external edge of the second conductive layer 28d overlaps the entire external edge of the first conductive layer 28c when viewed in the vertical direction. The entire internal edge of the second conductive layer 28d overlaps the entire internal edge of the first conductive layer 28c when viewed in the vertical direction.

The reference conductive layer 26b is located on the lower main surface of the insulating layer 14d. The first conductive layer 28c is located lower than the reference conductive layer 26b. Thus, the reference conductive layer 26b (the first metal foil layer) is in contact with the upper main surface (the third main surface) of the first conductive layer 28c. The reference conductive layer 26b has a rectangular loop shape when viewed in the vertical direction. More specifically, the reference conductive layer 26b extends along the two long sides and the two short sides of the insulating layer 14d when viewed in the vertical direction.

The external edge of the reference conductive layer 26*b* is located slightly outward from the external edge of the first conductive layer 28*c* when viewed in the vertical direction. The internal edge of the reference conductive layer 26*b* is located slightly inward from the internal edge of the first conductive layer 28*c* when viewed in the vertical direction.

The reference conductive layer 24 is located on the upper main surface of the insulating layer 14*e*. The second conductive layer 28*d* is located on the reference conductive layer 24. Thus, the reference conductive layer 24 (the second metal foil layer) is in contact with the lower main surface (the sixth main surface) of the second conductive layer 28*d*. The reference conductive layer 24 has a rectangular shape when viewed in the vertical direction. More specifically, the reference conductive layer 24 covers substantially the entire upper main surface of the insulating layer 14*e* when viewed in the vertical direction. The above reference conductive layers 22, 24, 26*a*, and 26*b* are connected to the reference potential. The reference potential is, for example, a ground potential.

As illustrated in FIG. 1 and FIG. 2, the multiple inter-layer connection conductors v7 extend through the insulating layers 15*a*, 14*c*, 14*d*, and 15*b* in the vertical direction (the first direction). The multiple inter-layer connection conductors v7 are arranged along the first conductive layers 28*b* and 28*c* and the second conductive layers 28*a* and 28*d* when viewed in the vertical direction. The multiple inter-layer connection conductors v7 are connected to the reference conductive layers 22, 24, 26*a*, and 26*b*, the first conductive layers 28*b* and 28*c*, and the second conductive layers 28*a* and 28*d*.

As illustrated in FIG. 3, the multiple inter-layer connection conductors v7 include multiple inter-layer connection conductors v7*a* and multiple inter-layer connection conductors v7*b*. The multiple inter-layer connection conductors v7*a* and the multiple inter-layer connection conductors v7*b* are alternately arranged. In FIG. 3, only one of the multiple inter-layer connection conductors v7*a* and one of the multiple inter-layer connection conductors v7*b* are denoted with the reference signs. The inter-layer connection conductors v7*a* and the inter-layer connection conductors v7*b* are adjacent to each other. Thus, no conductor exists between the inter-layer connection conductors v7*a* and the inter-layer connection conductors v7*b*. In the present preferred embodiment, the inter-layer connection conductors v7*b* are the inter-layer connection conductors located closest to the multiple inter-layer connection conductors v7*a*.

Each inter-layer connection conductor v7*a* includes inter-layer connection conductors v11 to v14. The inter-layer connection conductors v11 to v14 have a circular shape when viewed in the vertical direction. The inter-layer connection conductors v11 to v14 are arranged in a line in this order from the top to the bottom. The inter-layer connection conductor v11 (the first inter-layer connection conductor) extends through the insulating layer 15*a* (the first insulating layer) in the lower direction (the first direction). The inter-layer connection conductor v11 is connected to the second conductive layer 28*a* and the first conductive layer 28*b*. The diameter of the inter-layer connection conductor v11 is larger at the lower end than at the upper end. The inter-layer connection conductor v12 extends through the insulating layer 14*c* in the lower direction. The inter-layer connection conductor v12 is connected to the reference conductive layer 26*a*. The diameter of the inter-layer connection conductor v12 is larger at the lower end than at the upper end. The inter-layer connection conductor v13 extends through the insulating layer 14*d* in the upper direction. The inter-layer connection conductor v13 is connected to the inter-layer connection conductor v12 and the reference conductive layer 26*b*. The diameter of the inter-layer connection conductor v13 is larger at the upper end than at the lower end. The inter-layer connection conductor v14 (the first inter-layer connection conductor) extends through the insulating layer 15*b* (the first insulating layer) in the upper direction (the first direction). The inter-layer connection conductor v14 is connected to the first conductive layer 28*c* and the second conductive layer 28*d*. The diameter of the inter-layer connection conductor v14 is larger at the upper end than at the lower end.

The inter-layer connection conductors v7*a* and the inter-layer connection conductors v7*b* are adjacent to each other, and thus, the inter-layer connection conductors v11 (first inter-layer connection conductors) and inter-layer connection conductors v21 (second inter-layer connection conductors) are adjacent to each other. In the present preferred embodiment, the inter-layer connection conductors v21 (the second inter-layer connection conductors) are inter-layer connection conductors located closest to the inter-layer connection conductors v11 (the first inter-layer connection conductors).

Each inter-layer connection conductor v7*b* includes inter-layer connection conductors v21 to v24. The inter-layer connection conductors v21 to v24 have a circular shape when viewed in the vertical direction. The inter-layer connection conductors v21 to v24 are arranged in a line in this order from the top to the bottom. The inter-layer connection conductor v21 (the second inter-layer connection conductor) extends through the insulating layer 15*a* (the first insulating layer) in the lower direction (the first direction). The inter-layer connection conductor v21 is connected to the second conductive layer 28*a* and the first conductive layer 28*b*. The diameter of the inter-layer connection conductor v21 is larger at the lower end than at the upper end. The inter-layer connection conductor v22 extends through the insulating layer 14*c* in the lower direction. The inter-layer connection conductors v22 are connected to the reference conductive layer 26*a*. The diameter of the inter-layer connection conductor v22 is larger at the lower end than at the upper end. The inter-layer connection conductor v23 extends through the insulating layer 14*d* in the upper direction. The inter-layer connection conductor v23 is connected to the inter-layer connection conductor v22 and the reference conductive layer 26*b*. The diameter of the inter-layer connection conductor v23 is larger at the upper end than at the lower end. The inter-layer connection conductor v24 (the first inter-layer connection conductor) extends through the insulating layer 15*b* (the first insulating layer) in the upper direction (the first direction). The inter-layer connection conductor v24 is connected to the first conductive layer 28*c* and the second conductive layer 28*d*. The diameter of the inter-layer connection conductor v24 is larger at the upper end than at the lower end.

The inter-layer connection conductors v7*a* and the inter-layer connection conductors v7*b* are adjacent to each other, and thus, the inter-layer connection conductors v14 (the first inter-layer connection conductors) and the inter-layer connection conductors v24 (the second inter-layer connection conductors) are adjacent to each other. In the present preferred embodiment, the inter-layer connection conductors v24 (the second inter-layer connection conductors) are inter-layer connection conductors located closest to the inter-layer connection conductors v14 (the first inter-layer connection conductors).

The multiple inter-layer connection conductors v7a and v7b have the above structure. Thus, the reference conductive layer 26a (the first metal foil layer), the reference conductive layer 22 (the second metal foil layer), the first conductive layer 28b, and the second conductive layer 28a overlap the inter-layer connection conductors v11 (the first inter-layer connection conductors) and the inter-layer connection conductors v21 (the second inter-layer connection conductors) when viewed in the lower direction (the first direction). In the present preferred embodiment, the reference conductive layer 26a (the first metal foil layer), the reference conductive layer 22 (the second metal foil layer), the first conductive layer 28b, and the second conductive layer 28a overlap the inter-layer connection conductors v11 (the first inter-layer connection conductors) and the inter-layer connection conductors v21 (the second inter-layer connection conductors) when viewed in the lower direction (the first direction).

The second conductive layer 28a is in contact with the inter-layer connection conductors v11 (the first inter-layer connection conductors) and the inter-layer connection conductors v21 (the second inter-layer connection conductors). The reference conductive layer 22 is in contact with the second conductive layer 28a. Thus, the reference conductive layer 22 (the second metal foil layer) is electrically connected to the inter-layer connection conductors v11 (the first inter-layer connection conductors) and the inter-layer connection conductors v21 (the second inter-layer connection conductors) with the second conductive layer 28a interposed therebetween.

The first conductive layer 28b is in contact with the inter-layer connection conductors v11 (the first inter-layer connection conductors) and the inter-layer connection conductors v21 (the second inter-layer connection conductors). The reference conductive layer 26a is in contact with the first conductive layer 28b. Thus, the reference conductive layer 26a is electrically connected to the inter-layer connection conductors v11 (the first inter-layer connection conductors) and the inter-layer connection conductors v21 (the second inter-layer connection conductors) with the first conductive layer 28b interposed therebetween.

The reference conductive layer 26b (the first metal foil layer), the reference conductive layer 24 (the second metal foil layer), the first conductive layer 28c, and the second conductive layer 28d overlap the inter-layer connection conductors v14 (the first inter-layer connection conductors) and the inter-layer connection conductors v24 (the second inter-layer connection conductors) when viewed in the upper direction (the first direction). In the present preferred embodiment, the reference conductive layer 26b (the first metal foil layer), the reference conductive layer 24 (the second metal foil layer), the first conductive layer 28c, and the second conductive layer 28d overlap the inter-layer connection conductors v14 (the first inter-layer connection conductors) and the inter-layer connection conductors v24 (the second inter-layer connection conductors) when viewed in the upper direction (the first direction).

The first conductive layer 28c is in contact with the inter-layer connection conductors v14 (the first inter-layer connection conductors) and the inter-layer connection conductors v24 (the second inter-layer connection conductors). The reference conductive layer 26b is in contact with the first conductive layer 28c. Thus, the reference conductive layer 26b (the first metal foil layer) is electrically connected to the inter-layer connection conductors v14 (the first inter-layer connection conductors) and the inter-layer connection conductors v24 (the second inter-layer connection conductors) with the first conductive layer 28c interposed therebetween.

The second conductive layer 28d is in contact with the inter-layer connection conductors v14 (the first inter-layer connection conductors) and the inter-layer connection conductors v24 (the second inter-layer connection conductors). The reference conductive layer 24 is in contact with the second conductive layer 28d. Thus, the reference conductive layer 24 is electrically connected to the inter-layer connection conductors v14 (the first inter-layer connection conductors) and the inter-layer connection conductors v24 (the second inter-layer connection conductors) with the second conductive layer 28d interposed therebetween.

The above inter-layer connection conductors v11 to v14 and v21 to v24 are formed by filling the through-holes in the insulating layers 14c, 15a, and 15b with conductive paste and curing the conductive paste with heat. The first conductive layers 28b and 28c and the second conductive layers 28a and 28d are formed by applying conductive paste to the upper main surface or the lower main surface of each of the reference conductive layers 22 and 26a, 26b, and 24 and curing the conductive paste with heat. Thus, the first conductive layers 28b and 28c and the second conductive layers 28a and 28d have the same composition as the inter-layer connection conductors v11 and v14 (the first inter-layer connection conductors) and the inter-layer connection conductors v21 and v24 (the second inter-layer connection conductors). The conductive paste includes resin and metal powder. The metal powder is, for example, alloy powder of Sn and Cu. As described above, the inter-layer connection conductors v11 and v14 (the first inter-layer connection conductors) and the inter-layer connection conductors v21 and v24 (the second inter-layer connection conductors) include resin and metal. Herein, "having the same composition" indicates "including the same alloy including multiple metals". More specifically, for example, the same alloy including multiple metals includes an alloy of Sn and other metals such as SnAgCu.

The reference conductive layers 22, 24, 26a, and 26b are formed by, for example, etching metal foil disposed on the upper main surface or the lower main surface of each of the insulating layers 14b, 14c, 14d, and 14e. The metal foil is, for example, copper foil. The reference conductive layers 26a and 26b (the first metal foil layers) and the reference conductive layers 22 and 24 (the second metal foil layers) have a different composition from the first conductive layers 28b and 28c and the second conductive layers 28a and 28d.

First high-frequency signals are transmitted to the first signal conductor layer 20. The first high-frequency signals are, for example, digital signals. As illustrated in FIG. 1, the first signal conductor layer 20 is located on the upper main surface of the insulating layer 14c. The first signal conductor layer 20 has a linear shape when viewed in the vertical direction. The first signal conductor layer 20 extends in the lateral direction. The first signal conductor layer 20 is surrounded by the first conductive layer 28b when viewed in the vertical direction (the first direction). Thus, the first conductive layer 28b surrounds the first signal conductor layer 20 serving as a circuit component radiating noise when viewed in the vertical direction (the first direction).

The reference conductive layer 22 is located higher than the first signal conductor layer 20. The reference conductive layer 24 is located lower than the first signal conductor layer 20. Thus, the first signal conductor layer 20 and the reference conductive layers 22 and 24 have a strip line structure.

As illustrated in FIG. 2 and FIG. 3, the plane that passes the center of the insulating layer 15a in the vertical direction is defined as a plane S1. Here, "a distance D1 between each inter-layer connection conductor v11 (each first inter-layer connection conductor) and the corresponding inter-layer connection conductor v21 (the corresponding second inter-layer connection conductor)", and "a distance D2 between each inter-layer connection conductor v11 (each first inter-layer connection conductor) and the first signal conductor layer 20" are defined as below.

Defined as the distance D1 is the shortest distance between the cross section of each inter-layer connection conductor v11 (each first inter-layer connection conductor) in the plane S1 and the cross section of the corresponding inter-layer connection conductor v21 (the corresponding second inter-layer connection conductor) in the plane S1.

Defined as the distance D2 is the shortest distance, when viewed in the vertical direction, between the cross section of each inter-layer connection conductor v11 (each first inter-layer connection conductor) in the plane S1 and the first signal conductor layer 20.

Here, the distance D1 between each inter-layer connection conductor v11 (each first inter-layer connection conductor) and the corresponding inter-layer connection conductor v21 (the corresponding second inter-layer connection conductor) is shorter than the distance D2 between each inter-layer connection conductor v11 (each first inter-layer connection conductor) and the first signal conductor layer 20.

The signal terminal 40 and the reference terminals 42 and 44 are located at the left end portion of the upper main surface of the insulating layer 14a. The signal terminal 40 and the reference terminals 42 and 44 have a rectangular shape when viewed in the vertical direction. The reference terminal 42, the signal terminal 40, and the reference terminal 44 are arranged in this order from the front to the rear. The first signal conductor layer 20, the signal terminal 40, and the reference terminals 42 and 44 are formed by etching the metal foil disposed on, for example, the upper main surfaces of the insulating layers 14a and 14c. The metal foil is, for example, copper foil.

As illustrated in FIG. 1, the inter-layer connection conductor v1 extend through the insulating layers 14a and 14b, and 15a in the vertical direction. The inter-layer connection conductor v1 connects the signal terminal 40 and the left end portion of the first signal conductor layer 20. The inter-layer connection conductors v3 and v4 extend through the insulating layers 14a and 14b in the vertical direction. The inter-layer connection conductor v3 connects the reference terminal 42 and the reference conductive layer 22 to each other. The inter-layer connection conductor v4 connects the reference terminal 44 and the reference conductive layer 22 to each other. The above inter-layer connection conductors v1, v3, and v4 are formed by filling the through-holes formed in the insulating layers 14a and 14b, and 15a with conductive paste and curing the conductive paste with heat. The signal terminal 50, the reference terminals 52 and 54, and the inter-layer connection conductors v2, v5, and v6 are the opposite half of a laterally symmetric structure to the signal terminal 40, the reference terminals 42 and 44, and the inter-layer connection conductors v1, v3, and v4, and thus are not described.

The protective layer 16 substantially entirely covers the upper main surface of the insulating layer 14a. However, the protective layer 16 includes openings ha to hf. The signal terminal 40 is exposed to the outside of the multilayer substrate 10 through the opening ha. The reference terminal 42 is exposed to the outside of the multilayer substrate 10 through the opening hb. The reference terminal 44 is exposed to the outside of the multilayer substrate 10 through the opening hc. The signal terminal 50 is exposed to the outside of the multilayer substrate 10 through the opening hd. The reference terminal 52 is exposed to the outside of the multilayer substrate 10 through the opening he. The reference terminal 54 is exposed to the outside of the multilayer substrate 10 through the opening hf.

The above multilayer substrate 10 is included in the electronic device 100 such as a smartphone. As illustrated in FIG. 4, the electronic device includes the multilayer substrate 10 and a housing 102. The housing 102 accommodates the multilayer substrate 10.

As illustrated in FIG. 4, the multilayer substrate 10 is bent. More specifically, the multilayer substrate 10 includes a first area A1, a second area A2, and a third area A3. The first area A1 and the third area A3 are unbent areas in the multilayer substrate 10. The second area A2 is a bent area in the multilayer substrate 10.

The vertical direction in the first area A1 and the third area A3 is defined as a Z-axis direction. The second area A2 is bent in the Z-axis direction with respect to the first area A1. Bending of the multilayer substrate 10 indicates deformation of the multilayer substrate 10 as a result of application of the external force to the multilayer substrate 10. Deformation of the multilayer substrate 10 may be elastic deformation, plastic deformation, or elastic and plastic deformation.

Method for Manufacturing Multilayer Substrate 10

Figure 5:
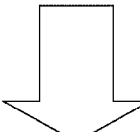
FIG. 5 is a cross-sectional view of the multilayer substrate 10 during manufacture.

Subsequently, a non-limiting example of a method for manufacturing the multilayer substrate 10 is described. FIG. 5 is a cross-sectional view during manufacture of the multilayer substrate 10.

The method for manufacturing the multilayer substrate 10 described below is the method for manufacturing the multilayer substrate 10 including the multilayer body 12 having a structure in which the multiple insulating layers 14a, 14b, 15a, 14c, 14d, 15b, and 14e, including the insulating layer 14b (the third insulating layer) having the lower main surface (the ninth main surface) and the upper main surface (the tenth main surface), the insulating layer 15a (the first insulating layer) having the lower main surface (the first main surface) and the upper main surface (the second main surface), and the insulating layer 14c (the second insulating layer) having the lower main surface (the seventh main surface) and the upper main surface (the eighth main surface) are laminated to be arranged in this order in the lower direction (the first direction). The lower main surface (the seventh main surface) of the insulating layer 14c is located lower than (in the first direction from) the upper main surface (the eighth main surface) of the insulating layer 14c. The lower main surface (the ninth main surface) of the insulating layer 14b is located lower than (in the first direction from) the upper main surface (the tenth main surface) of the insulating layer 14b.

First, the insulating layer 14c (the second insulating layer) having the upper main surface (the eighth main surface) on which the reference conductive layer 26a (the first metal foil layer) is disposed is prepared (a second preparation step). The insulating layer 14b (the third insulating layer) having the lower main surface (the ninth main surface) on which the reference conductive layer 22 (the second metal foil layer) is disposed is prepared (a third preparation step). More specifically, the metal foil is attached to the upper main surface of the insulating layer 14a, the lower main surface of the insulating layer 14b, the upper main surface of the insulating layer 14c, the lower main surface of the insulating layer 14d, and the upper main surface of the insulating layer 14e. Then, the metal foil is patterned through a photolithography step. Thus, the first signal conductor layer 20, the reference conductive layers 22, 24, 26a, and 26b, the signal terminals 40 and 50, and the reference terminals 42, 44, 52, and 54 are formed.

Subsequently, the insulating layer 15a (the first insulating layer) including first through-holes and second through-holes is prepared (a first preparation step). More specifically, multiple through-holes are formed in the insulating layers 14a to 14d, 15a, and 15b through radiation of laser beams. The through-holes are formed at positions where the inter-layer connection conductors v1 to v7 are to be formed.

Subsequently, the through-holes formed in the insulating layers 14c and 14d are filled with the conductive paste.

After the second preparation step, the conductive paste is applied to the reference conductive layer 26a (the first metal foil layer) (an application step). More specifically, the conductive paste is applied to the lower main surface of the reference conductive layer 22, the upper main surface of the reference conductive layer 26a, the lower main surface of the reference conductive layer 26b, and the upper main surface of the reference conductive layer 24. At this time, the conductive paste is applied in a sufficiently greater volume than the through-holes in the insulating layers 15a and 15b. The conductive paste has a rectangular loop shape when viewed in the vertical direction.

After the application step, the insulating layer 14b (the third insulating layer), the insulating layer 15a (the first insulating layer), and the insulating layer 14c (the second insulating layer) are laminated, and the first through-holes and the second through-holes are filled with the conductive paste while allowing the conductive paste to overflow from the first through-holes and the second through-holes to form, on the reference conductive layer 26a (the first metal foil layer), the conductive paste that is in contact with the conductive paste in the first through-holes and the conductive paste in the second through-holes (a lamination step). More specifically, the insulating layers 14a, 14b, 15a, 14c, 14d, 15b, and 14e, are arranged and laminated in this order from the top to the bottom. Then, the insulating layers 14a, 14b, 15a, 14c, 14d, 15b, and 14e are heated and pressed. By being pressed, the through-holes formed in the insulating layers 15a and 15b are filled with the conductive paste. As described above, the conductive paste has a volume fully greater than the through-holes of the insulating layers 15a and 15b. Thus, the conductive paste is left on the lower main surface of the reference conductive layer 22, the upper main surface of the reference conductive layer 26a, the lower main surface of the reference conductive layer 26b, and the upper main surface of the reference conductive layer 24. By being heated, the conductive paste cures. As a result of curing of the conductive paste in the through-holes, the inter-layer connection conductors v1 to v6 and the inter-layer connection conductors v7 are formed. In addition, as a result of curing of the conductive paste on the lower main surface of the reference conductive layer 22, the upper main surface of the reference conductive layer 26a, the lower main surface of the reference conductive layer 26b, and the upper main surface of the reference conductive layer 24, the first conductive layers 28b and 28c and the second conductive layers 28a and 28d are formed.

Finally, resin is applied to form the protective layer 16 on the insulating layer 14a. With the above steps, the multilayer substrate 10 is completed.

Effects

The multilayer substrate 10 can reduce failures that occur at the connections between the inter-layer connection conductors v11 and v21 and the reference conductive layer 26a, and at the connections between the inter-layer connection conductors v11 and v21 and the reference conductive layer 22. More specifically, the first conductive layer 28b is in contact with the lower main surface of the insulating layer 15a, and in contact with the inter-layer connection conductors v11 and the inter-layer connection conductors v21. The first conductive layer 28b has the same composition as the inter-layer connection conductors v11 and the inter-layer connection conductors v21. Thus, the lower ends of the inter-layer connection conductors v11 and the lower ends of the inter-layer connection conductors v21 are more reliably connected to the first conductive layer 28b. The reference conductive layer 26a is in contact with the lower main surface of the first conductive layer 28b. Thus, the lower ends of the inter-layer connection conductors v11 and the lower ends of the inter-layer connection conductors v21 are more reliably electrically connected to the reference conductive layer 26a.

As described above, the first conductive layer 28b has the same composition as the inter-layer connection conductors v11 and the inter-layer connection conductors v21. Thus, the inter-layer connection conductors v11 and v21 and the first conductive layer 28b can be concurrently formed by filling the through-holes with the conductive paste in an amount larger than necessary. Thus, a sufficient amount of conductive paste for the inter-layer connection conductors v11 and v21 is supplied. Thus, the amount of conductive paste supplied to the inter-layer connection conductors v11 and v21 is less likely to run short. Thus, the upper ends of the inter-layer connection conductors v11 and v21 are more reliably electrically connected to the reference conductive layer 22. Thus, the multilayer substrate 10 can reduce failures that occur at the connections between the inter-layer connection conductors v11 and v21 and the reference conductive layer 26a, and at the connections between the inter-layer connection conductors v11 and v21 and the reference conductive layer 22.

The multilayer substrate 10 can reduce failures that occur at the connections between the inter-layer connection conductors v11 and v21 and the reference conductive layer 26a. More specifically, the first conductive layer 28b has a sufficiently larger area than the lower ends of the inter-layer connection conductors v11 and v21. Thus, the lower ends of the inter-layer connection conductors v11 and v21 are less likely to fail to overlap the first conductive layer 28b. Specifically, the inter-layer connection conductors v11 and v21 and the first conductive layer 28b are more reliably in contact with each other. Furthermore, the reference conductive layer 26a is in contact with the lower main surface of the first conductive layer 28b. Specifically, the reference conductive layer 26a and the first conductive layer 28b are more reliably connected to each other. Thus, the multilayer substrate 10 can reduce failures that occur at the connections between the inter-layer connection conductors v11 and v21 and the reference conductive layer 26a.

The multilayer substrate 10 reduces intrusion of noise into the first signal conductor layer 20 from the outside of the multilayer substrate 10, and reduces radiation of noise from the first signal conductor layer 20 to the outside of the multilayer substrate 10. More specifically, the reference conductive layers 22, 24, 26a, and 26b are connected to the reference potential. Thus, the first conductive layers 28b and 28c and the second conductive layers 28a and 28d are also connected to the reference potential. Thus, in addition to the reference conductive layers 22, 24, 26a, and 26b, the first conductive layers 28b and 28c and the second conductive layers 28a and 28d also function as shields. Thus, the multilayer substrate 10 reduces intrusion of noise into the first signal conductor layer 20 from the outside of the multilayer substrate 10, and reduces radiation of noise from the first signal conductor layer 20 to the outside of the multilayer substrate 10. Particularly, the first conductive layer 28b has a loop shape surrounding the first signal conductor layer 20 when viewed in the vertical direction. The first signal conductor layer 20 is a circuit component that radiates noise. This structure thus more effectively reduces intrusion of noise into the first signal conductor layer 20 from the outside of the multilayer substrate 10, and reduces radiation of noise from the first signal conductor layer 20 to the outside of the multilayer substrate 10.

In the multilayer substrate 10, the insulating layers 14a to 14e, 15a, and 15b include thermoplastic resin. Thus, the multilayer substrate 10 can be easily plastically deformed.

In the multilayer substrate 10, the inter-layer connection conductors v21 are the inter-layer connection conductors located closest to the inter-layer connection conductors v11. Thus, excess conductive paste from the through-holes forms the inter-layer connection conductors v11 and v21 and the first conductive layer 28b. This structure can reduce failures that occur at the connections between the inter-layer connection conductors v11 and v21 and the reference conductive layer 26a, and at the connections between the inter-layer connection conductors v11 and v21 and the reference conductive layer 22.

First Modification Example

Figure 6:
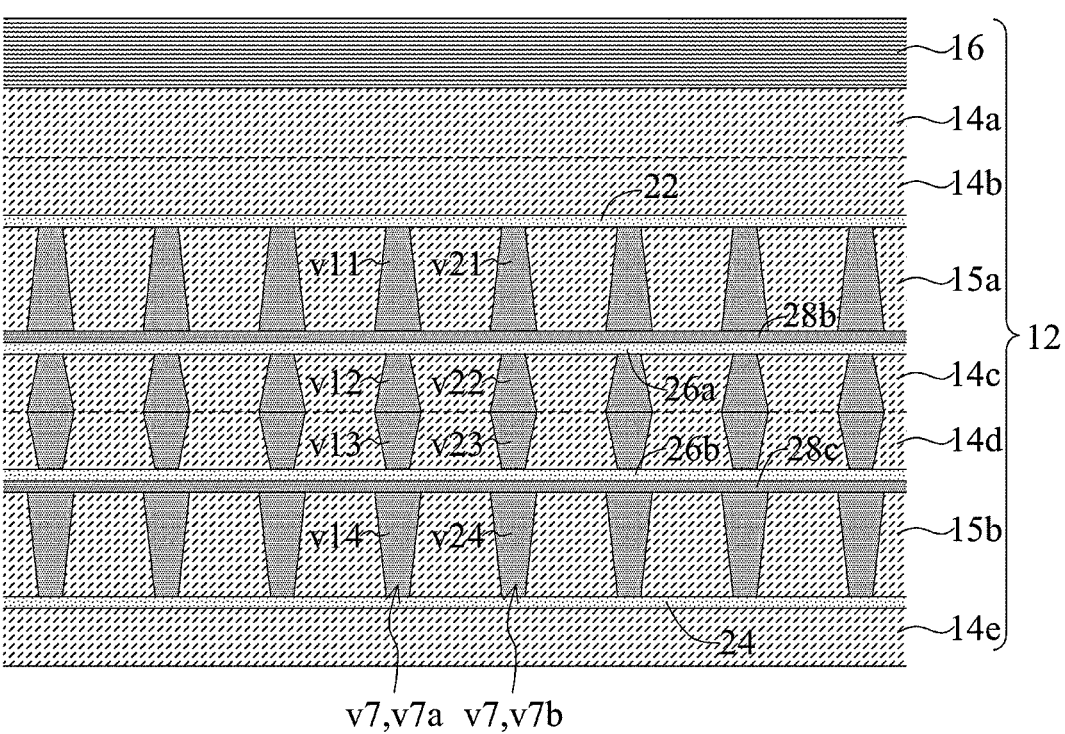

A multilayer substrate 10a according to a first modification example is described below with reference to the drawings. FIG. 6 is a cross-sectional view of the multilayer substrate 10a.

The multilayer substrate 10a differs from the multilayer substrate 10 in that it does not include the second conductive layers 28a and 28d. Other components of the multilayer substrate 10a are the same as those of the multilayer substrate 10. In the multilayer substrate 10a, the second conductive layers 28a and 28d are not essential components. The multilayer substrate 10a can achieve the same effects as the multilayer substrate 10.

Second Modification Example

Figure 7:
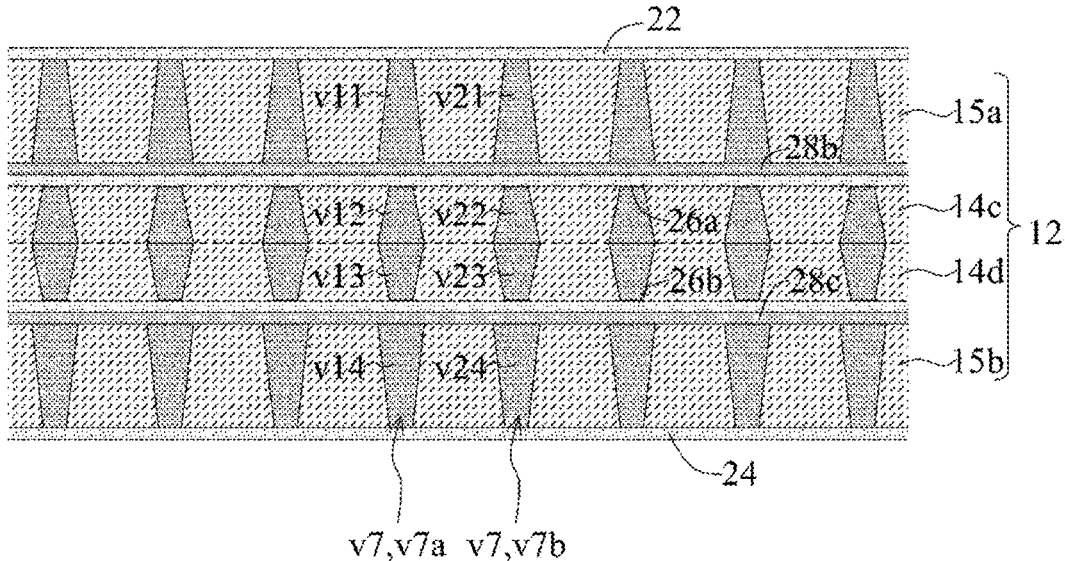
FIG. 7 is a cross-sectional view of a multilayer substrate 10b.

A multilayer substrate 10b according to a second modification example is described below with reference to the drawings. FIG. 7 is a cross-sectional view of the multilayer substrate 10b.

The multilayer substrate 10b differs from the multilayer substrate 10a in that it does not include the protective layer 16 and the insulating layers 14a, 14b, and 14e. Other components of the multilayer substrate 10a are the same as those of the multilayer substrate 10. As in the above case, the insulating layer 15a including the inter-layer connection conductors v11 and v21 may be located at the highest layer of the multilayer body 12. The insulating layer 15b including the inter-layer connection conductors v14 and v24 may be located at the lowest layer of the multilayer body 12. The multilayer substrate 10b can achieve the same effects as the multilayer substrate 10a.

Third Modification Example

Figure 8:
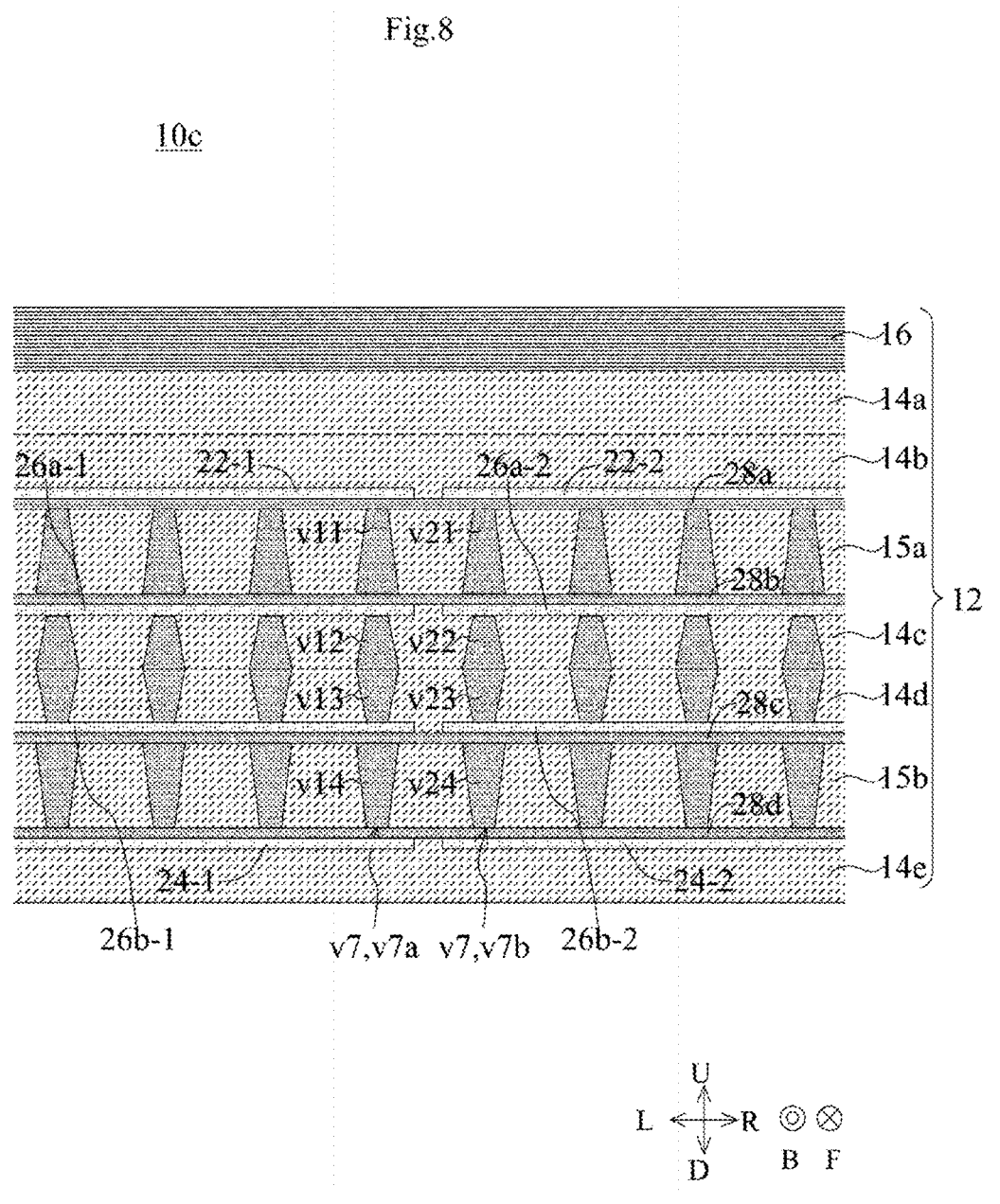

A multilayer substrate 10c according to a third modification example is described below with reference to the drawings. FIG. 8 is a cross-sectional view of the multilayer substrate 10c.

The multilayer substrate 10c differs from the multilayer substrate 10 in that it includes reference conductive layers 26a-1, 26a-2, 26b-1, and 26b-2 (first metal foil layers) instead of the reference conductive layers 26a and 26b, and includes reference conductive layers 22-1, 22-2, 24-1, and 24-2 (second metal foil layers) instead of the reference conductive layers 22 and 24.

More specifically, in the multilayer substrate 10, when viewed in the lower direction (the first direction), the reference conductive layer 26a (one of the at least one first metal foil layer) overlaps both the inter-layer connection conductors v11 (the first inter-layer connection conductors) and the inter-layer connection conductors v21 (the second inter-layer connection conductors). When viewed in the lower direction (the first direction), the reference conductive layer 22 (one of the at least one second metal foil layer) overlaps both the inter-layer connection conductors v11 (the first inter-layer connection conductors) and the inter-layer connection conductors v21 (the second inter-layer connection conductors).

In the multilayer substrate 10c, in contrast, when viewed in the lower direction (the first direction), the reference conductive layer 26a-1 (the first metal foil layer) overlaps the inter-layer connection conductors v11 (the first inter-layer connection conductors). When viewed in the lower direction (the first direction), the reference conductive layer 26a-2 (the first metal foil layer) overlaps the inter-layer connection conductors v21 (the second inter-layer connection conductors). When viewed in the lower direction (the first direction), the reference conductive layer 22-1 (the second metal foil layer) overlaps the inter-layer connection conductors v11 (the first inter-layer connection conductors). When viewed in the lower direction (the first direction), the reference conductive layer 22-2 (the second metal foil layer) overlaps the inter-layer connection conductors v21 (the second inter-layer connection conductors). The reference conductive layers 26b-1, 26b-2, 24-1, and 24-2 are the opposite half of a vertically symmetric structure to the reference conductive layers 26a-1, 26a-2, 22-1, and 22-2, and thus are not described. Other components of the multilayer substrate 10c are the same as those of the multilayer substrate 10, and thus are not described. The multilayer substrate 10c achieves the same effects as the multilayer substrate 10.

Fourth Modification Example

Figure 9:
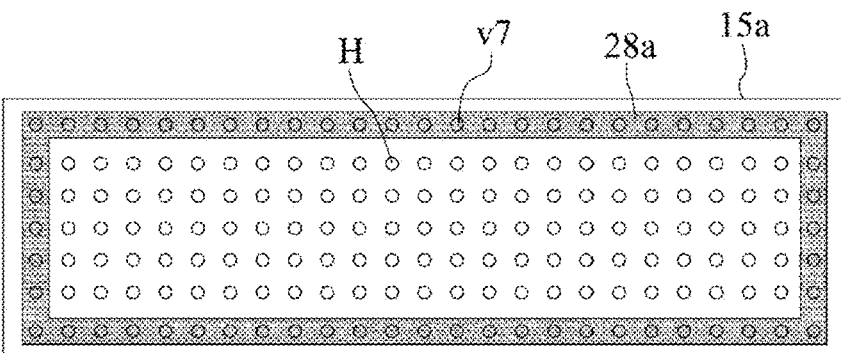
FIG. 9 is a top view of an insulating layer 15a of a multilayer substrate 10d.

A multilayer substrate 10d according to a fourth modification example is described below with reference to the drawings. FIG. 9 is a top view of an insulating layer 15a of the multilayer substrate 10d.

The insulating layer 15a may have a large number of through-holes H. Similarly, the insulating layer 15b may have a large number of through-holes H. Thus, the permittivity around the first signal conductor layer 20 is reduced. As a result, the dielectric loss of first high-frequency signals transmitted through the first signal conductor layer 20 is reduced.

Fifth Modification Example

Figure 10:
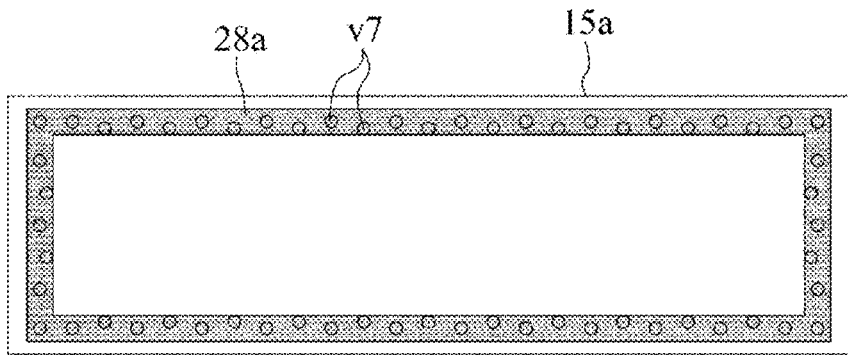
FIG. 10 is a top view of an insulating layer 15a of a multilayer substrate 10e.

A multilayer substrate 10e according to a fifth modification example is described below with reference to the drawings. FIG. 10 is a top view of an insulating layer 15a of the multilayer substrate 10e.

When viewed in the vertical direction, the multiple inter-layer connection conductors v7 may be arranged other than in a line along each side of the multilayer body 12. More specifically, the multiple inter-layer connection conductors v7 may be arranged in two lines along each side of the multilayer body 12. In this case, the multiple inter-layer connection conductors v7 are arranged in a zigzag manner.

Sixth Modification Example

Figure 11:
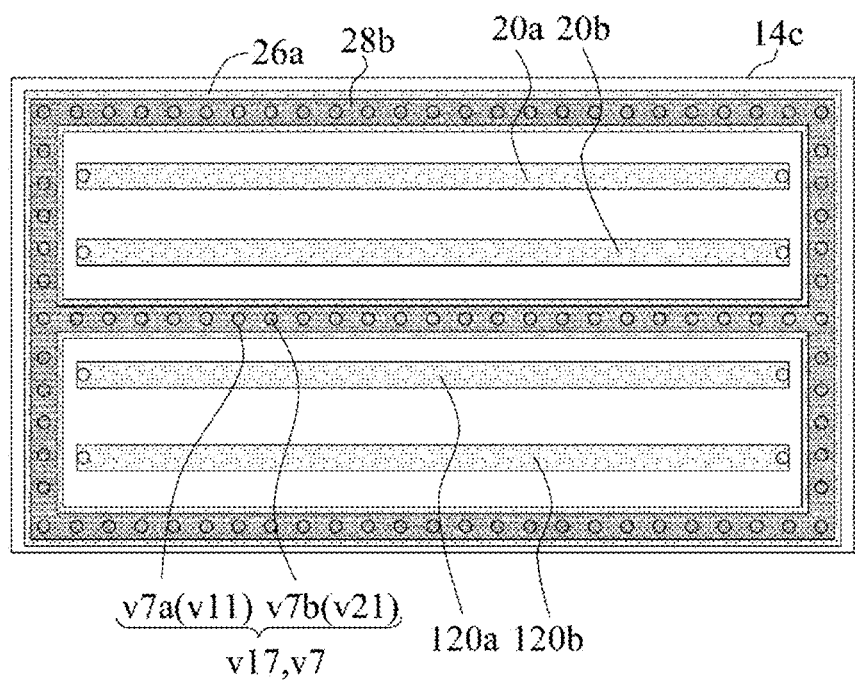
FIG. 11 is a top perspective view of a multilayer substrate 10f.

A multilayer substrate **10*f* according to a sixth modification example is described below with reference to the drawings. FIG. 11 is a top perspective view of the multilayer substrate 10*f***.

The multilayer substrate **10*f* differs from the multilayer substrate 10 in that it includes first signal conductor layers 20*a* and 20*b* instead of the first signal conductor layer 20, and it additionally includes second signal conductor layers 120*a* and 120*b*. More specifically, first high-frequency signals are transmitted to the first signal conductor layers 20*a* and 20*b*. The first high-frequency signals are digital signals. Second high-frequency signals are transmitted to the second signal conductor layers 120*a* and 120*b***. The second high-frequency signals are analog signals.

The multiple inter-layer connection conductors v7 are arranged in a line in the lateral direction at the center of the insulating layer **15*a* in the front-rear direction when viewed in the vertical direction. These multiple inter-layer connection conductors v7 are referred to as inter-layer connection conductors v17. The multiple inter-layer connection conductors v17 include multiple inter-layer connection conductors v7*a* and multiple inter-layer connection conductors v7*b*. The multiple inter-layer connection conductors v7*a* and the multiple inter-layer connection conductors v7*b*** are alternately arranged in the lateral direction.

The first signal conductor layers **20*a* and 20*b* are located in front of the inter-layer connection conductors v17. The second signal conductor layers 120*a* and 120*b* are located at the rear of the inter-layer connection conductors v17. Thus, the multiple inter-layer connection conductors v11 (the first inter-layer connection conductors) and the multiple inter-layer connection conductors v21 (the second inter-layer connection conductors) included in the multiple inter-layer connection conductors v17 are located between the first signal conductor layers 20*a* and 20*b* and the second signal conductor layers 120*a* and 120*b*** when viewed in the lower direction (the first direction).

Here, when viewed in the lower direction (the first direction), the front direction (the third direction) is a direction toward the first signal conductor layers **20*a* and 20*b* from the inter-layer connection conductors v11 (the first inter-layer connection conductors) included in the inter-layer connection conductors v17 located between the first signal conductor layers 20*a* and 20*b* and the second signal conductor layers 120*a* and 120*b*. When viewed in the lower direction (the first direction), the rear direction (the fourth direction) is a direction toward the second signal conductor layers 120*a* and 120*b* from the inter-layer connection conductors v11 (the first inter-layer connection conductors) included in the inter-layer connection conductors v17 located between the first signal conductor layers 20*a* and 20*b* and the second signal conductor layers 120*a* and 120*b*. Here, no signal conductor layer to which analog signals are transmitted is located in the area located in the front direction (the third direction) from the inter-layer connection conductors v11 (the first inter-layer connection conductors). Specifically, simply the first signal conductor layers 20*a* and 20*b* to which digital signals are transmitted are located in the area located in the front direction (the third direction) from the inter-layer connection conductors v11 (the first inter-layer connection conductors). No signal conductor layer to which digital signals are transmitted is located in the area located in the rear direction (the fourth direction) from the inter-layer connection conductors v11 (the first inter-layer connection conductors). Specifically, simply the second signal conductor layers 120*a* and 120*b* to which analog signals are transmitted are located in the area located in the rear direction (the fourth direction) from the inter-layer connection conductors v11 (the first inter-layer connection conductors). Other components of the multilayer substrate 10*f* are the same as those of the multilayer substrate 10, and thus are not described. The multilayer substrate 10*f* can achieve the same effects as the multilayer substrate 10**.

In the multilayer substrate **10*f*, the multiple inter-layer connection conductors v11 are located between the first signal conductor layers 20*a* and 20*b* and the second signal conductor layers 120*a* and 120*b*. This structure improves isolation between the first signal conductor layers 20*a* and 20*b* and the second signal conductor layers 120*a* and 120*b***.

Seventh Modification Example

Figure 12:
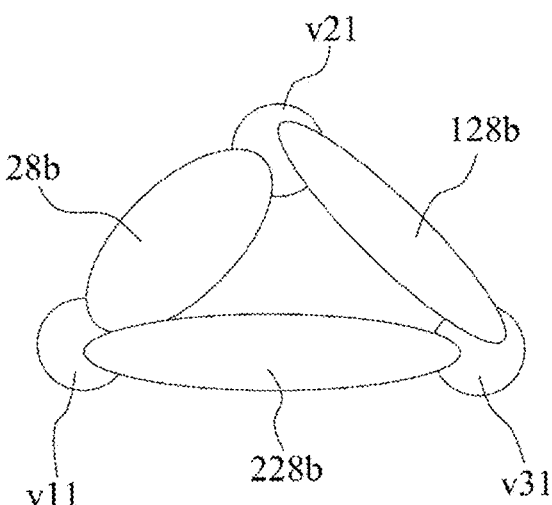
FIG. 12 is a bottom view of an insulating layer 15a of a multilayer substrate 10g.

A multilayer substrate **10*g* according to a seventh modification example is described below with reference to the drawings. FIG. 12 is a bottom view of an insulating layer 15*a* of the multilayer substrate 10*g***.

The multilayer substrate **10*g* also includes inter-layer connection conductors v31, a third conductive layer 128*b*, and a fourth conductive layer 228*b*. The inter-layer connection conductors v31 (third inter-layer connection conductors) extend through the insulating layer 15*a*** (the first insulating layer) in the lower direction (the first direction).

The first conductive layer **28*b* is in contact with the inter-layer connection conductors v11 (the first inter-layer connection conductors) and the inter-layer connection conductors v21 (the second inter-layer connection conductors). The third conductive layer 128*b* is in contact with the lower main surface (the first main surface) of the insulating layer 15*a* (the first insulating layer). The third conductive layer 128*b* is in contact with the inter-layer connection conductors v21 (the second inter-layer connection conductors) and the inter-layer connection conductors v31 (the third inter-layer connection conductors). The fourth conductive layer 228*b* is in contact with the lower main surface (the first main surface) of the insulating layer 15*a* (the first insulating layer). The fourth conductive layer 228*b* is in contact with the inter-layer connection conductors v31 (the third inter-layer connection conductors) and the inter-layer connection conductors v11** (the first inter-layer connection conductors).

The first conductive layer **28*b* and the fourth conductive layer 228*b* are in contact with each other. In contrast, the third conductive layer 128*b* is in no contact with the first conductive layer 28*b* and the fourth conductive layer 228*b*. The multilayer substrate 10*g* described above can achieve the same effects as the multilayer substrate 10**.

Eighth Modification Example

Figure 13:
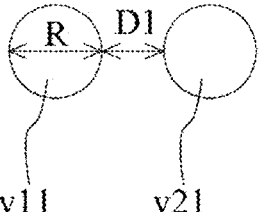

A multilayer substrate **10*h* according to an eighth modification example is described below with reference to the drawings. FIG. 13 is a cross-sectional view of an insulating layer 15*a* of the multilayer substrate 10*h* taken perpendicularly to the vertical direction. The cross section is located at the center of the insulating layer 15*a*** in the vertical direction.

The distance D1 between each inter-layer connection conductor v11 (the first inter-layer connection conductor)

and the corresponding inter-layer connection conductor v21 (the second inter-layer connection conductor) is shorter than the diameter R of the inter-layer connection conductor v11 (the first inter-layer connection conductor). The diameter R of the inter-layer connection conductor v11 is a diameter of the inter-layer connection conductor v11 in a cross section located at the center in the vertical direction of the insulating layer 15a.

Other Preferred Embodiments

The multilayer substrate according to the present invention is not limited to the multilayer substrates 10, and 10a to 10h, and is changeable within the scope of its gist. Two or more of the multilayer substrates 10, and 10a to 10h may be combined as appropriate.

In the multilayer substrates 10 and 10a to 10h, the inter-layer connection conductors v11 (the first inter-layer connection conductors) and the inter-layer connection conductors v21 (the second inter-layer connection conductors) include metal having a lower melting point than the reference conductive layer 26a (the first metal foil layer) and the reference conductive layer 22 (the second metal foil layer). The inter-layer connection conductors v11 (the first inter-layer connection conductors) and the inter-layer connection conductors v21 (the second inter-layer connection conductors) may include no resin. The inter-layer connection conductors v11 (the first inter-layer connection conductors) and the inter-layer connection conductors v21 (the second inter-layer connection conductors) include, for example, solder. Solder includes Pb and Sn. Instead, solder may include no Pb.

The at least one first metal foil layer may include at least one reference conductive layer (the first metal foil layer). Thus, the at least one first metal foil layer may include two or more reference conductive layers (first metal foil layers).

The at least one second metal foil layer may include at least one reference conductive layer (the second metal foil layer). Thus, the at least one second metal foil layer may include two or more reference conductive layers (second metal foil layers).

The second conductive layer 28a is not an essential component. The reference conductive layers 24 and 26b, the first conductive layer 28c, and the second conductive layer 28d are not essential components.

The first signal conductor layer 20 is not an essential component.

The reference conductive layers 22, 24, 26a, and 26b may be connected to the potential other than the ground potential.

The first metal foil layer and the second metal foil layer may be conductive layers other than the reference conductive layers. The first metal foil layer and the second metal foil layer may be, for example, signal conductor layers to which high-frequency signals are transmitted.

The inter-layer connection conductors v11 (the first inter-layer connection conductors) and the inter-layer connection conductors v21 (the second inter-layer connection conductors) may be located other than adjacent to each other. Thus, other conductors may be located between the inter-layer connection conductors v11 and the inter-layer connection conductors v21.

In the multilayer substrate 10g, the first conductive layer 28b and the fourth conductive layer 228b may be in no contact with each other.

The distance D1 between each inter-layer connection conductor v11 (each first inter-layer connection conductor) and the corresponding inter-layer connection conductor v21 (the corresponding second inter-layer connection conductor)

may be greater than or equal to the diameter R of the inter-layer connection conductor v11 (the first inter-layer connection conductor).

Instead of the conductive paste, metal cream may be used. The metal cream is a mixture of metal and liquid flux. The metal cream is, for example, solder cream. When the metal cream is solder cream, metal is, for example, an alloy of Sn and Pb. Instead, metal may include no Pb.

The first high-frequency signals may be analog signals. The second high-frequency signals may be digital signals.

The circuit component that radiates noise may be, for example, an integrated circuit (IC), a high-frequency circuit, an active element, or an electronic component.

The insulating layers 14a to 14e, 15a, and 15b may include the material other than thermoplastic resin.

A diffusion layer may be formed at the boundary between the inter-layer connection conductors v11 and v21 and the reference conductive layer 22. A diffusion layer may be formed at the boundary between the inter-layer connection conductors v11 and v21 and the reference conductive layer 26a. A diffusion layer may be formed at the boundary between the inter-layer connection conductors v14 and v24 and the reference conductive layer 26b. A diffusion layer may be formed at the boundary between the inter-layer connection conductors v14 and v24 and the reference conductive layer 24. A diffusion layer is an area including an alloy of a metal included in the inter-layer connection conductors v11 and v21 and a metal included in the reference conductive layers 22, 24, 26a, and 26b. For example, when the reference conductive layer 22 (the first metal foil layer) is formed from a metal foil of Cu, and the inter-layer connection conductors v11 and v21 include SnAgCu, the diffusion layer includes a Cu—Sn based alloy. The first signal conductor layer 20 may be bent in the direction perpendicular to the vertical direction (for example, in the front-rear direction) when viewed in the vertical direction. The first signal conductor layer 20 may be bent in the direction perpendicular to the vertical direction as a result of the multilayer substrate 10 being plastically deformed and/or elastically deformed. The first signal conductor layer 20 may be bent in the direction perpendicular to the vertical direction without deformation of the multilayer substrate 10.

The first conductive layers 28b and 28c and the second conductive layers 28a and 28d may have a shape other than a rectangular loop shape as illustrated in FIG. 1 when viewed in the vertical direction. The first conductive layers 28b and 28c and the second conductive layers 28a and 28d may be, for example, bent, winding, or straight.

The applied conductive paste may have a shape other than a rectangular loop shape when viewed in the vertical direction. The applied conductive paste may have a shape including multiple separate areas. For example, the step of applying the conductive paste in a shape including multiple separate areas may be a step of using a metal mask including multiple through-holes arranged in a loop shape. In this case, the multiple portions of the conductive paste may be apart from each other. At the time of bonding, the multiple portions of the conductive paste may come into contact with each other.

The shape of the through-holes is not limited to a circle, but may be another shape such as a quadrangle. The shape of the through-holes may be a rectangle extending along the shape of the electrode.

The fourth direction may be a direction other than the direction opposite to the third direction.

The first signal conductor layers 20*a* and 20*b* and the second signal conductor layers 120*a* and 120*b* may be disposed on different insulating layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate, comprising:
a multilayer body including a plurality of insulating layers laminated in a first direction, the plurality of insulating layers including a first insulating layer including a first main surface and a second main surface, the first main surface being located above or below the second main surface in the first direction;
a plurality of inter-layer connection conductors that extend through the first insulating layer in the first direction, and that include a first inter-layer connection conductor and a second inter-layer connection conductor;
a first conductive layer that is in contact with the first main surface of the first insulating layer, and in contact with the first inter-layer connection conductor and the second inter-layer connection conductor, and that includes a third main surface and a fourth main surface, the third main surface being located above or below the fourth main surface in the first direction, and the first conductive layer having a same composition as the first inter-layer connection conductor and the second inter-layer connection conductor;
at least one first metal foil layer that is in contact with the third main surface of the first conductive layer, the at least one first metal foil layer overlapping the first inter-layer connection conductor and the second inter-layer connection conductor when viewed in the first direction, the at least one first metal foil layer having a composition different from a composition of the first conductive layer; and
at least one second metal foil layer located above or below the first insulating layer in a second direction, the second direction being opposite to the first direction, the at least one second metal foil layer overlapping the first inter-layer connection conductor and the second inter-layer connection conductor when viewed in the first direction, the at least one second metal foil layer being electrically connected to the first inter-layer connection conductor and the second inter-layer connection conductor, the at least one second metal foil layer having a composition different from a composition of the first conductive layer; wherein
the first conductive layer includes a single conductive layer that is in contact with the first inter-layer connection conductor and the second inter-layer connection conductor.

2. The multilayer substrate according to claim 1, wherein the second inter-layer connection conductor is an inter-layer connection conductor located closest to the first inter-layer connection conductor.

3. The multilayer substrate according to claim 1, wherein, when viewed in the first direction, one of the at least one first metal foil layer overlaps both the first inter-layer connection conductor and the second inter-layer connection conductor.

4. The multilayer substrate according to claim 1, wherein, when viewed in the first direction, one of the at least one second metal foil layer overlaps both the first inter-layer connection conductor and the second inter-layer connection conductor.

5. The multilayer substrate according to claim 1, further comprising:
a second conductive layer that is in contact with the second main surface of the first insulating layer, and in contact with the first inter-layer connection conductor and the second inter-layer connection conductor, and that includes a fifth main surface and a sixth main surface, the fifth main surface being above or below the sixth main surface in the first direction, the second conductive layer having a same composition as the first inter-layer connection conductor and the second inter-layer connection conductor; wherein
the at least one second metal foil layer is in contact with the sixth main surface of the second conductive layer.

6. The multilayer substrate according to claim 1, wherein the first inter-layer connection conductor and the second inter-layer connection conductor include resin and metal.

7. The multilayer substrate according to claim 1, wherein the first inter-layer connection conductor and the second inter-layer connection conductor include a metal having a lower melting point than the first metal foil layer and the second metal foil layer.

8. The multilayer substrate according to claim 7, wherein the first inter-layer connection conductor and the second inter-layer connection conductor include no resin.

9. The multilayer substrate according to claim 1, further comprising:
a third inter-layer connection conductor that extends through the first insulating layer in the first direction; and
a third conductive layer that is in contact with the first main surface of the first insulating layer and in contact with the second inter-layer connection conductor and the third inter-layer connection conductor.

10. The multilayer substrate according to claim 9, further comprising:
a fourth conductive layer that is in contact with the first main surface of the first insulating layer, and in contact with the third inter-layer connection conductor and the first inter-layer connection conductor.

11. The multilayer substrate according to claim 1, wherein a distance between the first inter-layer connection conductor and the second inter-layer connection conductor is shorter than a diameter of the first inter-layer connection conductor.

12. The multilayer substrate according to claim 1, further comprising:
a first signal conductor layer to which a first high-frequency signal is able to be transmitted.

13. The multilayer substrate according to claim 12, wherein a distance between the first inter-layer connection conductor and the second inter-layer connection conductor is shorter than a distance between the first inter-layer connection conductor and the first signal conductor layer.

14. The multilayer substrate according to claim 12, wherein the first high-frequency signal is a digital signal.

15. The multilayer substrate according to claim 12, further comprising:
a second signal conductor layer to which a second high-frequency signal is able to be transmitted; wherein
the first inter-layer connection conductor is located between the first signal conductor layer and the second signal conductor layer when viewed in the first direction.

16. The multilayer substrate according to claim 15, wherein the second high-frequency signal is an analog signal.

17. The multilayer substrate according to claim 16, wherein a third direction is a direction toward the first signal conductor layer from the first inter-layer connection conductor located between the first signal conductor layer and the second signal conductor layer when viewed in the first direction;

a fourth direction is a direction toward the second signal conductor layer from the first inter-layer connection conductor located between the first signal conductor layer and the second signal conductor layer when viewed in the first direction;

no signal conductor layer to which an analog signal is transmitted is located in an area above or below the first inter-layer connection conductor in the third direction; and no signal conductor layer to which a digital signal is transmitted is located in an area above or below the first inter-layer connection conductor in the fourth direction.

18. The multilayer substrate according to claim 12, wherein, when viewed in the first direction, the first conductive layer has a loop shape surrounding the first signal conductor layer.

19. The multilayer substrate according to claim 18, wherein, when viewed in the first direction, the first conductive layer surrounds a circuit component operative to radiate noise.

20. The multilayer substrate according to claim 1, wherein the plurality of insulating layers include thermoplastic resin.

21. An electronic device comprising the multilayer substrate according to claim 1.

22. A method for manufacturing a multilayer substrate including a multilayer body including a plurality of insulating layers including a third insulating layer including a ninth main surface and a tenth main surface, a first insulating layer including a first main surface and a second main surface, and a second insulating layer including a seventh main surface and an eighth main surface, the plurality of insulating layers being laminated to be arranged in a first direction in order of the third insulating layer, the first insulating layer, and the second insulating layer, the first main surface being located above or below the second main surface in the first direction, the seventh main surface being located above or below the eighth main surface in the first direction, and the ninth main surface being located above or below the tenth main surface in the first direction;

the method comprising:

preparing the first insulating layer including a first through-hole and a second through-hole;

preparing the second insulating layer including the eighth main surface on which a first metal foil layer is located;

preparing the third insulating layer including the ninth main surface on which a second metal foil layer is located;

applying conductive paste or metal cream onto the first metal foil layer after the second preparation step; and after the application step, laminating the third insulating layer, the first insulating layer, and the second insulating layer, filling the first through-hole and the second through-hole with the conductive paste or the metal cream, and allowing the conductive paste or the metal cream to overflow from the first through-hole and the second through-hole to form the conductive paste or the metal cream in the first through-hole and the conductive paste or the metal cream that is in contact with the conductive paste or the metal cream in the first through-hole on the first metal foil layer; wherein the conductive paste or the metal cream overflows from the first through-hole and the second through-hole such that the conductive paste or the metal cream flows outside of the first through-hole and the second through-hole.

* * * * *